(12) United States Patent
Chou et al.

(10) Patent No.: US 6,864,193 B2
(45) Date of Patent: Mar. 8, 2005

(54) AQUEOUS CLEANING COMPOSITION CONTAINING COPPER-SPECIFIC CORROSION INHIBITOR

(75) Inventors: Chun-Li Chou, Shinjuang (TW); Hun-Jan Tao, Hsin-Chu (TW); Peng-Fu Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 162 days.

(21) Appl. No.: 10/379,769

(22) Filed: Mar. 5, 2003

(65) Prior Publication Data

US 2004/0175964 A1 Sep. 9, 2004

(51) Int. Cl.[7] .............................................. H01L 21/00
(52) U.S. Cl. ...................................... 438/906; 438/905
(58) Field of Search ................................ 438/906, 905, 438/680, 681, 687, 689, 692, 725, 789, 790, 793, 794

(56) References Cited

U.S. PATENT DOCUMENTS

| | | | |
|---|---|---|---|
| 5,798,323 A | * | 8/1998 | Honda et al. .............. 510/176 |
| 6,287,346 B1 | * | 9/2001 | Ofosu-Asante et al. ........ 8/103 |
| 6,306,219 B1 | * | 10/2001 | Ofosu-Asante et al. ........ 134/1 |
| 2001/0011515 A1 | | 8/2001 | Aoki et al. |
| 2001/0014534 A1 | | 8/2001 | Aoki et al. |
| 2001/0034313 A1 | | 10/2001 | Honda et al. |
| 2001/0050350 A1 | | 12/2001 | Wojtczak et al. |
| 2001/0051318 A1 | | 12/2001 | Chu |
| 2002/0012882 A1 | | 1/2002 | Muranaka et al. |
| 2002/0013239 A1 | | 1/2002 | Sahbari |
| 2002/0013240 A1 | | 1/2002 | Sahbari |

* cited by examiner

*Primary Examiner*—David Nhu
(74) *Attorney, Agent, or Firm*—Duane Morris LLP

(57) ABSTRACT

A composition and method for fabricating a semiconductor wafer containing copper is disclosed, which method includes plasma etching a dielectric layer from the surface of the wafer, plasma ashing a resist from the surface of the wafer, and cleaning the wafer surface by contacting same with a cleaning formulation, which includes the following components and their percentage by weight ranges shown: (a) from about 0.01 to 80% by weight organic solvent, (b) from about 0.01 to 30% by weight copper chelating agent, (c) from about 0.01 to 10% by weight copper inhibitor, and (d) from about 0.01 to 70% by weight water.

8 Claims, No Drawings

AQUEOUS CLEANING COMPOSITION CONTAINING COPPER-SPECIFIC CORROSION INHIBITOR

FIELD OF THE INVENTION

The present invention relates generally to chemical formulations useful in semiconductor manufacturing, and particularly to chemical formulations that are utilized to remove residue from wafers following a resist plasma ashing step. More specifically, the present invention relates to cleaning formulations for the removal of organic residue from semiconductor wafers containing delicate copper interconnecting structures.

BACKGROUND OF THE INVENTION

The prior art teaches the utilization of various chemical formulations to remove residues and clean wafers, following a resist ashing step. Some of these prior art chemical formulations include alkylene compositions containing amines and/or tetraalkyl ammonium hydroxides, water and/or other solvents, and chelating agents. Other formulations are based on acidic to neutral solutions containing ammonium fluoride.

The various prior art formulations have drawbacks that include unwanted removal of metal or insulator layers, and the corrosion of desirable metal layers, particularly copper or copper alloy features. Some prior art formulations employ corrosion inhibiting additives to prevent undesirable copper metal corrosion during the cleaning process. However, conventional corrosion-inhibiting additives typically have detrimental effects on the cleaning process because such additives interact with the residue and inhibit dissolution of such residue into the cleaning fluid. Furthermore, conventional additives do not easily rinse off the copper surface after completion of the cleaning process. Such additives, therefore, remain on the surface sought to be cleaned, and result in contamination of the integrated circuits. Contamination of the integrated circuit can adversely increase the electrical resistance of contaminated areas, and cause unpredictable conducting failure within the circuit.

The formulation of post chemical mechanical planarization (CMP) cleaners for advanced integrated circuit manufacturing, such as copper and tungsten interconnect materials, includes slurry removal and residue dissolution components that accelerate the physical cleaning process. However, these conventional additives typically have detrimental effects on the metal surface by increasing resistance and corrosion sensitivity.

SUMMARY OF THE INVENTION

The present invention relates generally to chemical formulations useful in semiconductor manufacturing for removing residue from wafers following a resist plasma ashing step. In one aspect, the present invention relates to a method of removing residue from a wafer following a resist plasma ashing step on such wafer, comprising contacting the wafer with a cleaning formulation, including (a) an organic solvent, (b) a copper chelating agent, (c) a copper inhibitor, and (d) water. Another aspect of the invention relates to a wafer cleaning formulation, including (a) an organic solvent, (b) a copper chelating agent, (c) a copper inhibitor, and (d) water.

DETAILED DESCRIPTION OF THE INVENTION

The present invention relates to a composition and method for fabricating a semiconductor wafer containing copper, which method includes plasma etching a dielectric layer from the surface of the wafer, plasma ashing a resist from the surface of the wafer, and cleaning the wafer surface by contacting same with a cleaning formulation, which includes the following components and their percentage by weight ranges shown: (a) from about 0.01 to 80% by weight organic solvent, (b) from about 0.01 to 30% by weight copper chelating agent, (c) from about 0.01 to 10% by weight copper inhibitor, and (d) from about 0.01 to 70% by weight water. The formulations of the present invention effectively remove inorganic residues following a plasma ashing step.

Such formulations also effectively remove metal halide and metal oxide residues following plasma ashing, and effectively remove slurry particles of aluminum oxides and other oxides remaining after CMP.

The formulations of the present invention provide better stripping performance with less corrosivity than formulations containing either ammonium fluoride or amines. Formulations in accordance with the present invention also provide better stripping performance at lower processing temperatures than conventional amine-containing formulations.

The components of the formulation as described above can be of any suitable type of species, as will be appreciated by those of ordinary skill in the art. Specific illustrative and preferred formulation components for each of the ingredients of the formulation are described below.

Examples of organic solvent include propylene glycol, monomethyl ether, ethylene glycol, 1,4-butynediol, and butyrolactone.

Examples of copper chelating agent include oxalic acid, malonic acid, citric acid and lactic acid. An example of a copper inhibitor is an aldehyde acid.

In a further aspect, the present invention relates to a semiconductor wafer cleaning formulation for use in post plasma ashing semiconductor fabrication, comprising the following components in the percentage by weight (based on the total weight of the formulation) ranges shown below:

| Material | Weight % |
| --- | --- |
| Organic solvent | 0.01–80% |
| Copper chelating agent | 0.01–30% |
| Copper inhibitor | 0.01–10% |
| Water | 0.01–70% |
| Total | 100% |

The method for fabricating a semiconductor wafer including copper in accordance with the present invention may occur at a temperature of from about 25–40° C., a pH of from about 1–7, and a copper etch rate of about 2.56 A/min., with a temperature of about 25° C. particularly preferred.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

What is claimed is:

1. A semiconductor wafer cleaning formulation, comprising the following components in the percentage by weight ranges shown, based on the total weight of such components:

(a) from about 0.01% to 80% organic solvent;
(b) from about 0.01% to 30% copper chelating agent;
(c) from about 0.01% to 10% copper inhibitor; and
(d) from about 0.01% to 70% water.

2. The cleaning formulation as recited in claim 1, wherein the organic solvent is selected from the group consisting of propylene glycol, monomethyl ether, ethylene glycol, 1,4-butynediol and butyrolactone.

3. The cleaning formulation as recited in claim 1, wherein the copper chelating agent is selected from the group consisting of oxalic acid, malonic acid, citric acid and lactic acid.

4. The cleaning formulation as recited in claim 1, wherein the copper inhibitor is an aldehyde acid.

5. A method for fabricating a semiconductor wafer containing copper, comprising:

plasma etching a dielectric layer from a surface of the wafer;

plasma ashing a resist from the surface of the wafer;

cleaning the wafer surface by contacting same with a cleaning formulation, comprising the following components in the percentage by weight ranges shown, based on the total weight of such components:

(a) from about 0.01% to 80% organic solvent;
(b) from about 0.01% to 30% copper chelating agent;
(c) from about 0.01% to 10% copper inhibitor; and
(d) from about 0.01% to 70% water.

6. The method as recited in claim 5, wherein the fabricating of the semiconductor containing copper occurs at a temperature of about 25–40° C.

7. The method as recited in claim 5, wherein the fabricating of the semiconductor containing copper occurs at a pH of about 1–7.

8. The method as recited in claim 5, wherein the fabricating of the semiconductor containing copper occurs at a copper etch rate of about 2.56 A/min.

* * * * *